(12) United States Patent
Umeda et al.

(10) Patent No.: US 9,505,951 B2
(45) Date of Patent: Nov. 29, 2016

(54) POLISHING COMPOSITION

(71) Applicant: FUJIMI INCORPORATED, Kiyosu-shi, Aichi (JP)

(72) Inventors: Takahiro Umeda, Kiyosu (JP); Shogo Onishi, Kiyosu (JP); Takeshi Yoshikawa, Kiyosu (JP); Yoshihiro Kachi, Kiyosu (JP)

(73) Assignee: FUJIMI INCORPORATED, Kiyosu-Shi (JP)

( * ) Notice: Subject to any disclaimer, the term of this patent is extended or adjusted under 35 U.S.C. 154(b) by 0 days.

(21) Appl. No.: 14/440,216

(22) PCT Filed: Sep. 30, 2013

(86) PCT No.: PCT/JP2013/076569
§ 371 (c)(1),
(2) Date: May 1, 2015

(87) PCT Pub. No.: WO2014/069139
PCT Pub. Date: May 8, 2014

(65) Prior Publication Data
US 2015/0315418 A1 Nov. 5, 2015

(30) Foreign Application Priority Data
Nov. 2, 2012 (JP) ................................ 2012-243073

(51) Int. Cl.
*C09K 13/00* (2006.01)
*C09G 1/02* (2006.01)
(Continued)

(52) U.S. Cl.
CPC .............. *C09G 1/02* (2013.01); *C09K 3/1436* (2013.01); *C09K 3/1463* (2013.01); *H01L 21/3212* (2013.01); *H01L 21/31053* (2013.01)

(58) Field of Classification Search
CPC ...... C09G 1/02; C09K 3/1463; C09K 3/1436
USPC ........................................................ 252/79.1
See application file for complete search history.

(56) References Cited

U.S. PATENT DOCUMENTS

| 7,485,162 | B2 | 2/2009 | Matsuda et al. |
| 2005/0108949 | A1 | 5/2005 | Matsuda et al. |

(Continued)

FOREIGN PATENT DOCUMENTS

| JP | 2005-158970 A | 6/2005 |
| JP | 2009-256184 A | 11/2009 |

(Continued)

*Primary Examiner* — Roberts Culbert
(74) *Attorney, Agent, or Firm* — Foley & Lardner LLP

(57) ABSTRACT

[Problem] Provided is a polishing composition that can sufficiently maintain a high polishing rate for a barrier layer and an insulating film and suppress the occurrence of a surface defect such as erosion or fang.

[Solution] Provided is a polishing composition which is used in the application to polish a polishing object having a barrier layer, a metal wiring layer and an insulating film, the polishing composition including abrasive grains, an oxidant, a metal corrosion inhibitor, a pH adjusting agent and water, in which an aspect ratio of abrasive grains is 1.22 or less and a ratio D90/D10 of a diameter D90 of particles when a cumulative particle weight from the fine particle side reaches 90% of the total particle weight to a diameter D10 of particles when the cumulative particle weight from the fine particle side reaches 10% of the total particle weight of the entire particles is 1.5 or more in a particle size distribution of the abrasive grains determined by a laser diffraction scattering method.

6 Claims, 1 Drawing Sheet

(51) Int. Cl.
*H01L 21/321* (2006.01)
*C09K 3/14* (2006.01)
*H01L 21/3105* (2006.01)

(56) References Cited

U.S. PATENT DOCUMENTS

2011/0027997 A1 2/2011 Shinoda et al.
2011/0081780 A1 4/2011 Shida et al.
2013/0302984 A1 11/2013 Tsuchiya et al.

FOREIGN PATENT DOCUMENTS

| JP | 2010-041027 A | 2/2010 |
| JP | 2010-041029 A | 2/2010 |
| WO | WO 2009/128494 A1 | 10/2009 |
| WO | WO 2010/098278 A1 | 9/2010 |
| WO | WO 2012/102144 A1 | 8/2012 |

(a)
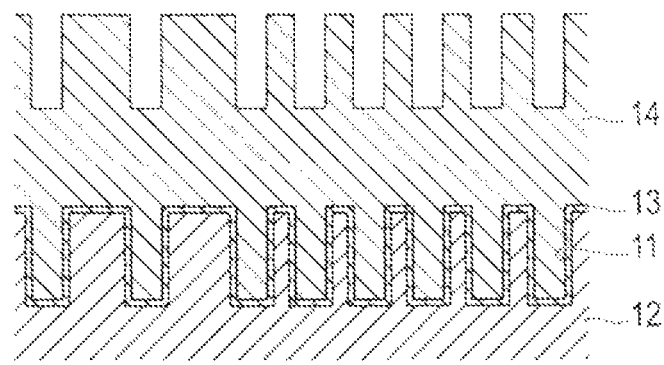
(b)
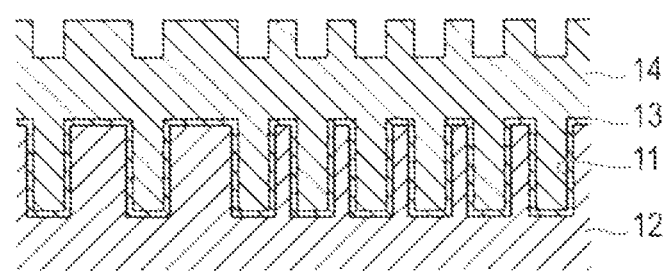
(c)
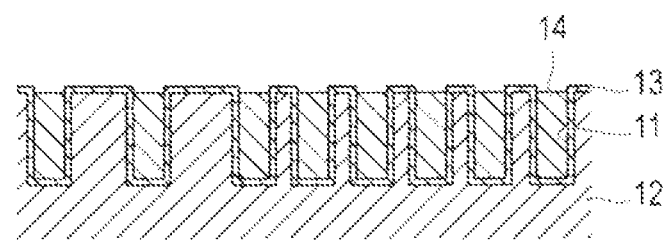
(d)
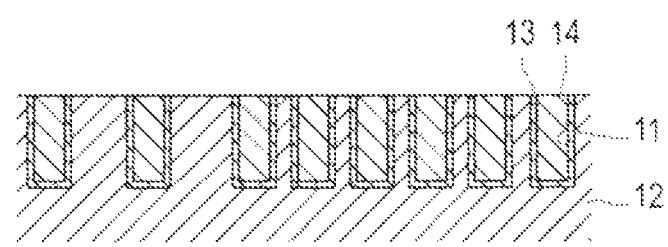

POLISHING COMPOSITION

TECHNICAL FIELD

The present invention relates to a polishing composition.

BACKGROUND

In recent years, new fine processing techniques have been developed as the LSI is highly integrated and exhibits high performance. The chemical mechanical polishing (hereinafter, simply referred to as CMP as well) method is also one of them and is a technique that is frequently used for the flattening of the interlayer insulating film, the formation of metal plug and the formation of embedded wiring (damascene wiring) in the LSI manufacturing process, especially the multilayer wiring forming process.

A general method of CMP is a method in which the polishing pad is pasted onto a circular polishing table (platen), and the polishing pad surface is wet with a polishing agent, the surface on which a metal film is formed of the substrate is pressed against the polishing pad, the polishing table is rotated in a state in which a predetermined pressure (hereinafter, simply referred to as the polishing pressure as well) is applied from the back surface thereof, and the convex portion of the metal film is removed by the mechanical friction between the polishing agent and the convex portion of the metal film.

On the other hand, tantalum, a tantalum alloy, a tantalum compound or the like is formed on the lower layer of copper, a copper alloy or the like which is the wire as a barrier layer for preventing copper diffusion into the interlayer insulating film. Hence, the exposed barrier layer except the wiring part embedding copper or the copper alloy needs to be removed by CMP.

In order to form each wiring layer, it is general that first, CMP of metal film which removes the excess wiring material attached by the plating method or the like (hereinafter, also referred to as the "metal film CMP") is performed over one stage or a multistage, and then CMP which removes the barrier layer exposed to the surface by the previous CMP (hereinafter, also referred to as the "barrier layer CMP") is performed. However, there is a problem that the so-called dishing that the wiring portion is excessively polished or a surface defect such as erosion and fang is caused by the metal film CMP.

In order to decrease dishing, it is required to finally form a wiring layer having less steps such as dishing or erosion by adjusting the polishing rate of the metal wiring portion and the polishing rate of the barrier metal portion in the barrier layer CMP performed after the metal film CMP. In other words, it is desirable that the polishing rate of the barrier layer or the insulating film be moderately high in the barrier layer CMP since dishing that the wiring portion is polished faster or erosion as a consequence of the dishing occurs is a case in which the polishing rate of the barrier layer or the interlayer insulating film is relatively slower compared to the metal wiring portion. This is because it is also desirable in that it is required to relatively increase the polishing rate of the barrier layer or the insulating film from the reasons as described above since dishing is actually often caused by the metal film CMP in addition to that there is a merit of increasing the throughput of the barrier layer CMP.

In addition, it is also required to suppress fang as a surface defect. As one factor to cause fang, it is considered that the components contained in the polishing liquid is unevenly localized at the boundary surface between the wiring layer and the region other than the wiring layer such as the carrier layer or the interlayer insulating film and thus the vicinity of the boundary surface is excessively polished. For example, it is considered that the polishing rate locally increases at the boundary surface when the abrasive grain component contained in the polishing liquid is present at a high concentration in the vicinity of the boundary surface and thus the boundary surface is excessively polished.

As described above, as a technique to decrease the surface defect such as erosion or fang while maintaining a relatively higher polishing rate for the barrier layer and the interlayer insulating film with respect to the wiring layer, a polishing liquid which is a polishing liquid for polishing the copper film, barrier metal film and interlayer insulating film of a semiconductor integrated circuit and contains silica particles having a specific silanol group density and an organic acid is disclosed, for example, in JP 2010-041029 A and JP 2010-041027 A.

SUMMARY OF INVENTION

Technical Problem

However, in the polishing liquid described in JP 2010-041029 A and JP 2010-041027 A above, the maintenance of a high polishing rate of the barrier layer and the insulating film layer as well as the suppression of the surface defect such as fang or erosion are not yet sufficient, and thus more improvement is desired. In addition, there is room for improvement in decreasing the step defect such as dishing while maintaining a high polishing rate in the metal wiring layer.

Accordingly, an object of the invention is to provide a polishing composition which can sufficiently maintain a high polishing rate for the barrier layer and the insulating film and suppress the surface defect such as fang or erosion. In addition, another object of the invention is to provide a means capable of realizing a decrease of the step defect such as dishing while maintaining a high polishing rate for the metal wiring layer.

Means for Solving Problem

The present inventors have conducted intensive researches in order to solve the above problems. As a result, it has been found out that the above problems can be solved by the use of a polishing composition, which contains abrasive grains, an oxidant, a metal corrosion inhibitor, a pH adjusting agent and water, in which an aspect ratio of the abrasive grains is 1.22 or less and a ration D90/10 of a diameter D90 of particles when the cumulative particle weight from the fine particle side reaches 90% of the total particle weight to a diameter D10 of particles when the cumulative particle weight from the fine particle side reaches 10% of the total particle weight of the entire particles is 1.5 or more in a particle size distribution of the abrasive grains determined by a laser diffraction scattering method. In particular, the invention has been completed on the basis of a new fining that the above problems can be solved by maintaining a constant value with regard to the aspect ratio and particle size distribution of the abrasive grains which have been in a trade-off relationship with respect to the two problems of the polishing rate and the surface defect in the related art.

In other words, the invention is a polishing composition used in the application to polish a polishing object having a barrier layer, a metal wiring layer and an insulating film, which includes abrasive grains, an oxidant, a metal corrosion inhibitor, a pH adjusting agent and water, in which the aspect ratio of the abrasive grains is 1.22 or less and the ratio D90/D10 of the diameter D90 of particles when the cumulative particle weight from the fine particle side reaches 90% of the total particle weight to the diameter D10 of particles when the cumulative particle weight from the fine particle side reaches 10% of the total particle weight of the entire particles is 1.5 or more in the particle size distribution of the abrasive grains determined by a laser diffraction scattering method.

BRIEF DESCRIPTION OF DRAWINGS

FIGS. 1(a) to 1(d) are cross-sectional schematic views illustrating an example of a polishing object according to the invention.

DESCRIPTION OF EMBODIMENTS

The invention is a polishing composition used in the application to polish a polishing object having a barrier layer, a metal wiring layer and an insulating film, which includes abrasive grains, an oxidant, a metal corrosion inhibitor, a pH adjusting agent and water and in which the aspect ratio of the abrasive grains is 1.22 or less and the ratio D90/D10 of the diameter D90 of particles when the cumulative particle weight from the fine particle side reaches 90% of the total particle weight to the diameter D10 of particles when the cumulative particle weight from the fine particle side reaches 10% of the total particle weight of the entire particles is 1.5 or more in the particle size distribution of the abrasive grains determined by a laser diffraction scattering method. Such a configuration makes it possible to sufficiently maintain a high polishing rate for a barrier layer and an insulating film and to suppress the occurrence of a surface defect such as fang or erosion. In addition, such a configuration makes it possible to suppress dishing while maintaining a high Cu rate.

Although the detailed reasons is unknown that the effect as described above is obtained by the use of the polishing composition of the invention, it has been known in the related art that the polishing rate for the polishing object is improved but the surface defect gets worse when the aspect ratio of the abrasive grains is increased. In addition, it has been considered that it is possible to decrease the surface defect by narrowing the width of the particle size distribution of the abrasive grains. In contrast, in the invention, it is considered that the influence of the abrasive grains on the surface defect caused by the shape thereof is eliminated by lowering the aspect ratio of the abrasive grains to a constant value or less, that is, shaping the abrasive grains into a more perfect circular shape. On the other hand, it is considered that the use of the abrasive grains having the ratio D90/D10 which defines the width of the particle size distribution of a certain value or more, that is, a wider width of the particle size distribution increases the proportion of the abrasive grains which have a greater particle size, and as a result, it is possible to prevent the surface defect such as dishing and fang while maintaining a high polishing rate. Incidentally, the above mechanism is a presumption, and thus the invention is not limited to the above mechanism in any way.

Consequently, the polishing composition of the invention can be used for CMP of the metal wiring layer as a CMP slurry for metal wiring layer, can be also used for CMP of the barrier layer and/or the insulating layer as a CMP slurry for barrier layer and/or insulating layer, and can suppress the surface defect while maintaining a high polishing rate in both CMPs. Hence, a suitable polishing composition of the invention is a composition for metal wiring polishing, and another suitable embodiment thereof is a composition for barrier layer and/or insulating layer polishing.

[Polishing Object]

The polishing object according to the invention has a barrier layer, a metal wiring layer and an insulating film.

First, an example of the polishing object and the semiconductor wiring process according to the invention will be described with reference to FIG. 1. The semiconductor wiring process usually includes the following steps.

As illustrated in FIG. 1(a), a barrier layer 13 and a metal wiring layer 14 are sequentially formed on an insulating layer 12 having a trench 11 provided on a substrate (not illustrated). The barrier layer 13 is formed on the insulating layer 12 so as to cover the surface of the insulating layer 12 prior to the formation of the metal wiring layer 14. The thickness of the barrier layer 13 is thinner than the depth and width of the trench 11. The metal wiring layer 14 is formed on the barrier layer 13 so as to bury at least the trench 11 subsequently to the formation of the barrier layer 13.

In a case in which at least the outer portion of the metal wiring layer 14 and the outer portion of the barrier layer 13 are removed by CMP, first, most of the outer portion of the metal wiring layer 14 is removed as illustrated in FIG. 1(b). Next, the rest of the outer portion of the metal wiring layer 14 is removed in order to expose the upper surface of the outer portion of the barrier layer 13 as illustrated in FIG. 1(c).

Thereafter, at least the portion of the metal wiring layer 14 positioned outside the trench 11 (outer portion of the metal wiring layer 14) and the portion of the barrier layer 13 positioned outside the trench 11 (outer portion of the barrier layer 13) are removed by CMP. As a result, at least a part of the portion of the barrier layer 13 positioned inside the trench 11 (inner portion of the barrier layer 13) and at least a part of the portion of the metal wiring layer 14 positioned inside the trench 11 (inner portion of the metal wiring layer 14) are left on the insulating layer 12 as illustrated in FIG. 1(d). In other words, a part of the barrier layer 13 and a part of the metal wiring layer 14 on the inside of the trench 11 are left. Consequently, the part of the metal wiring layer 14 left on the inside of the trench 11 functions as wiring.

The material contained in the barrier layer is not particularly limited, and examples thereof may include tantalum, titanium, tungsten, cobalt and a noble metal such as gold, silver, platinum, palladium, rhodium, ruthenium, iridium and osmium. These metals may be contained in the barrier layer in the form of an alloy or a metal compound. Tantalum or a noble metal is preferable. These metals may be used singly or in combination of two or more kinds.

In addition, the metal contained in the metal wiring layer is not also particularly limited, and examples thereof may include copper, aluminum, hafnium, cobalt, nickel, titanium and tungsten. These metals may be contained in the metal wiring layer in the form of an alloy or a metal compound. The metal wiring layer preferably contains copper or a copper alloy since its conductivity is high and the speeding up of the LSI can be achieved. These metals may be used singly or in combination of two or more kinds.

Examples of the material contained in the insulating film may include TEOS (tetraethoxysilane).

Next, the configuration of the polishing composition of the invention will be described in detail.

[Abrasive Grains]

The abrasive grains contained in the polishing composition have an action of mechanically polishing a polishing object and improving the polishing rate of the polishing object by the polishing composition.

The abrasive grains used may be any of inorganic particles, organic particles and organic-inorganic composite particles. Specific examples of the inorganic particles may include particles composed of a metal oxide such as silica, alumina, ceria and titania, silicon nitride particles, silicon carbide particles and boron nitride particles. Specific examples of the organic particles may include polymethyl methacrylate (PMMA) particles. The abrasive grains may be used singly or as a mixture of two or more kinds. Moreover, the abrasive grains used may be a commercially available product or a synthetic product.

Among these abrasive grains, silica is preferable and colloidal silica is particularly preferable.

The abrasive grains may be surface-modified. The value of zeta potential of usual colloidal silica is close to zero under an acidic condition and thus silica particles tend to aggregate without electrically repelling one another under an acidic condition. In contrast, the abrasive grains which are surface-modified so as to have a relatively great negative zeta potential value even under an acidic condition strongly repel one another even under an acidic condition to be favorably dispersed, and as a result, the storage stability of the polishing composition is improved. Such surface-modified abrasive grains can be obtained, for example, by mixing a metal such as aluminum, titanium or zirconium or an oxide thereof with the abrasive grains and doping on the surface of the abrasive grains.

Among them, colloidal silica having an organic acid immobilized is particularly preferable. The immobilization of an organic acid on the surface of colloidal silica to be contained in the polishing composition is performed, for example, by chemically bonding the functional group of the organic acid on the surface of colloidal silica. The immobilization of organic acid to colloidal silica cannot be accomplished by only allowing colloidal silica to simply coexist with an organic acid. It is possible to perform the immobilization, for example, by the method described in "Sulfonic acid-functionalized silica through quantitative oxidation of thiol groups", Chem. Commun., 246-247 (2003) when sulfonic acid of a kind of organic acids is immobilized on colloidal silica. Specifically, it is possible to obtain colloidal silica having sulfonic acid immobilized on the surface by coupling a silane coupling agent having a thiol group such as 3-mercaptopropyltrimethoxysilane to colloidal silica and then oxidizing the thiol group with hydrogen peroxide. Alternatively, it is possible to perform the immobilization, for example, by the method described in "Novel Silane Coupling Agents Containing a Photolabile 2-Nitrobenzyl Ester for Introduction of a Carboxy Group on the Surface of Silica Gel", Chemistry Letters, 3, 228-229 (2000) when carboxylic acid is immobilised on colloidal silica. Specifically, it is possible to obtain colloidal silica having carboxylic acid immobilized on the surface by coupling a silane coupling agent containing a photoreactive 2-nitrobenzyl ester to colloidal silica and then irradiating with light.

The lower limit of the average primary particle size of the abrasive grains is preferably 20 nm or more, more preferably 25 nm or more, even more preferably 30 nm or more and particularly preferably 50 nm or more. In addition, the upper limit of the average primary particle size of the abrasive grains is preferably 200 nm or less, more preferably 150 nm or less and even more preferably 100 nm or less. In such a range, the polishing rate of the polishing object by the polishing composition is improved and also it is possible to further suppress the occurrence of the surface defect on the surface of the polishing object after being polished using the polishing composition. Incidentally, the average primary particle size of the abrasive grains is calculated, for example, based on the specific surface area of the abrasive grains measured by the BET method.

Hereinafter, the method to calculate the average particle size from the specific surface area of the particles in a case in which the abrasive grains are silica will be specifically described. The surface area A of n particles becomes $A=n\pi d^2$ where the shape of the silica particles are assumed to be spherical, the diameter of the particles is d (nm) and the specific gravity is $\rho$ (g/cm$^3$). The mass N of n particles becomes $N=\rho n\pi d^3/6$. The specific surface area S is expressed by the surface area of all the constituent particles per unit mass of the powder. In that case, the specific surface area S of the n particles becomes $S=A/N=6/\rho d$. The specific gravity of the silica particles is $\rho=2.2$, and thus it is average particle size (nm)=2727/S (m$^2$/g).

The lower limit of the average secondary particle size of the abrasive grains is preferably 25 nm or more, more preferably 30 nm or more and even more preferably 35 nm or more. In addition, the upper limit of the average secondary particle size of the abrasive grains is preferably 300 nm or less, more preferably 260 nm or less and even more preferably 220 nm or less. In such a range, the polishing rate of the polishing object by the polishing composition is improved and also it is possible to further suppress the occurrence of the surface defect on the surface of the polishing object after being polished using the polishing composition. Incidentally, the secondary particles mentioned here refers to the particles formed by the association of the abrasive grains in the polishing composition, and the average secondary particle size of these secondary particles can be measured, for example, by a dynamic light scattering method.

The average secondary particle size of the abrasive grains is controlled by a pH, an electric conductivity and a physical treatment such as filtering.

The lower limit of the content of the abrasive grains in the polishing composition is preferably 0.005% by weight or more, more preferably 0.5% by weight or more, still more preferably 1% by weight or more and most preferably 3% by weight or more. In addition, the upper limit of the content of the abrasive grains in the polishing composition is preferably 50% by weight or less, more preferably 30% by weight or less and even more preferably 20% by weight or less. In such a range, the polishing rate of the polishing object is improved and also it is possible to cut down the cost of the polishing composition and to further suppress the occurrence of the surface defect on the surface of the polishing object after being polished using the polishing composition.

The upper limit of the aspect ratio of the abrasive grains in the polishing composition is 1.22 or less, preferably 1.20 or less and more preferably 1.18 or less. In addition, the lower limit of the average primary particle size of the abrasive grains in the polishing composition is not particularly limited but is preferably 20 nm or more. In such a range, it is possible to eliminate the influence of the abrasive grains on the surface defect caused by the shape thereof and to further suppress the occurrence of the surface defect on the surface of the polishing object after being polished using the polishing composition. Incidentally, the aspect ratio is the average of the value obtained by dividing the length or the long side of the smallest rectangle circumscribing the image of the abrasive particles taken by a scanning electron microscope by the length of the short side of the same rectangle for 500 abrasive particles, and can be obtained using the general image analysis software. Therefore, the lower limit of the aspect ratio is 1. The aspect ratio of the abrasive grains in the polishing composition may be measured in the composition or using the abrasive grains before being prepared as the composition.

The lower limit of the ratio D90/D10 of the diameter D90 of particles when the cumulative particle weight from the fine particle side reaches 90% of the total particle weight to the diameter D10 of particles when the cumulative particle weight from the fine particle side reaches 10% of the total particle weight of the entire particles is 1.5 or more, preferably 1.8 or more and more preferably 2.0 or more in the particle size distribution of the abrasive grains in the polishing composition determined by a laser diffraction scattering method. In addition, the upper limit of the ratio D90/D10 of the diameter D90 of particles when the cumulative particle weight from the fine particle side reaches 90% of the total particle weight to the diameter D10 of particles when the cumulative particle weight from the fine particle side reaches 10% of the total particle weight of the entire particles is not particularly limited but is preferably 5.0 or less and more preferably 3.0 or less in the particle size distribution of the abrasive grains in the polishing composition determined by a laser diffraction scattering method. In such a range, the polishing rate of the polishing object is improved and also it is possible to further suppress the occurrence of the surface defect on the surface of the polishing object after being polished using the polishing composition. Incidentally, it is preferable that the ratio D90/D10 when polishing the metal wiring layer be 3.0 or less from the viewpoint of decreasing dishing.

The ratio D90/D10 of the abrasive grains in the polishing composition is controlled by a pH, an electric conductivity and a physical treatment such as filtering.

[Oxidant]

Specific examples of the oxidant according to the invention may include hydrogen peroxide, peracetic acid, a percarbonate salt, urea peroxide, perchloric acid; and a persulfate salt such as sodium persulfate, potassium persulfate and ammonium persulfate. These oxidants may be used singly or as a mixture of two or more kinds.

Among them, a persulfate salt and hydrogen peroxide are preferable and hydrogen peroxide is particularly preferable.

The lower limit of the content (concentration) of the oxidant in the polishing composition is preferably 0.01% by weight or more, more preferably 0.05% by weight or more and even more preferably 0.1% by weight or more. There is an advantage that the polishing rate by the polishing composition is improved as the content of the oxidant increases.

In addition, the upper limit of the content (concentration) of the oxidant in the polishing composition is preferably 10% weight or less, more preferably 5% by weight or less and even more preferably 3% by weight or less. There is an advantage that it is possible to diminish the burden to treat the polishing composition after trying for polishing, namely the effluent in addition to that the material cost of the polishing composition can be cut down as the content of the oxidant decreases. In addition, there is also an advantage that the excessive oxidation of the surface of the polishing object by the oxidant is less likely to occur.

[Water]

The polishing composition of the invention contains water as a dispersion medium or solvent for dispersing or dissolving each component. Water containing impurities as little as possible is preferable from the viewpoint of suppressing the inhibition of the impurities on the action of other components, and specifically, pure water, ultrapure water or distilled water from which the impurity ions are removed by an ion exchange resin and the foreign matters are removed through filtration is preferable.

[Metal-Corrosion Inhibitor]

The addition of the metal corrosion inhibitor into the polishing composition makes it possible to further suppress the occurrence of the hollow at the side of the wiring formed by polishing using the polishing composition. In addition, it is possible to further suppress the occurrence of the surface defect such as dishing on the surface of the polishing object after being polished using the polishing composition.

The metal corrosion inhibitor usable is not particularly limited but is preferably a heterocyclic compound or a surfactant. The number of members constituting the heterocyclic ring in the heterocyclic compound is not particularly limited. In addition, the heterocyclic compound may be a single ring compound or a polycyclic compound having a condensed ring. The metal corrosion inhibitor may be used singly or as a mixture of two or more kinds. Moreover, the metal corrosion inhibitor used may be a commercially available product or a synthetic product.

Specific examples of the heterocyclic compound usable as the metal corrosion inhibitor may include a nitrogen-containing heterocyclic compound such as a pyrrole compound, a pyrazole compound, an imidazole compound, a triazole compound, a tetrazole compound, a pyridine compound, a pyrazine compound, a pyridazine compound, a pyrindine compound, an indolizine compound, an indole compound, an isoindole compound, an indazole compound, a purine compound, a quinolizine compound, a quinoline compound, an isoquinoline compound, a naphtyridine compound, a phthalazine compound, a quinoxaline compound, a quinazoline compound, a cinnoline compound, a buterizine compound, a thiazole compound, an isothiazole compound, an oxazole compound, an isoxazole compound, a furazan compound, and the like.

For more specific examples, examples of the pyrazole compound may include 1H-pyrazole, 4-nitro-3-pyrazole carboxylic acid, 3,5-pyrazole carboxylic acid, 3-amino-5-phenyl pyrazole, 5-amino-3-phenyl-pyrazole, 3,4,5-tribromopyrazole, 3-aminopyrazole, 3,5-dimethylpyrazole, 3,5-dimethyl-1-hydroxymethyl pyrazole, 3-methylpyrazole, 1-methylpyrazole, 3-amino-5-methylpyrazole, 4-aminopyrazolo[3,4-d]pyrimidine, allopurinol, 4-chloro-1H-pyrazolo[3,4-D]pyrimidine, 3,4-dihydroxy-6-methylpyrazolo(3,4-B)-pyridine, 6-methyl-1H-pyrazolo(3,4-b)pyridin-3-amine and the like.

Examples of the imidazole compound may include imidazole, 1-methylimidazole, 2-methylimidazole, 4-methylimidazole, 1,2-dimethylpyrazole, 2-ethyl-4-methylimidazole, 2-isopropylimidazole, benzimidazole, 5,6-dimethylbenzimidazole, 2-amino-benzimidazole, 2-chloro-benzimidazole, 2-methylbenzimidazole, 2-(1-hydroxyethyl)benzimidazole, 2-hydroxy-benzimidazole, 2-phenylbenzimidazole, 2,5-dimethylbenzimidazole, 5-methylbenzimidazole, 5-nitrobenzimidazole, 1H-purine and the like.

Examples of the triazole compound may include 1,2,3-triazole(1H-BTA), 1,2,4-triazole, 1-methyl-1,3,4-triazole, methyl-1H-1,2,4-triazole-3-carboxylate, 1,2,4-triazole-3-carboxylic acid, methyl 1,2,4-triazole-3-carboxylate, 1H-1,2,4-triazole-3-thiol, 3,5-diamino-1H-1,2,4-triazole, 3-amino-1,2,4-triazole-5-thiol, 3-amino-1H-1,2,4-triazole, 3-amino-5-benzyl-4H-1,2,4-triazole, 3-amino-5-methyl-4H-1,2,4-triazole, 3-nitro-1,2,4-triazole, 3-bromo-5-nitro-1,2,4-triazole, 4-(1,2,4-triazol-1-yl)phenol, 4-amino-1,2,4-triazole, 4-amino-3,5-dipropyl-4H-1,2,4-triazole, 4-amino-3,5-dimethyl-4H-1,2,4-triazole, 4-amino-3,5-dipeptyl-4H-1,2,4-triazole, 5-methyl-1,2,4-triazole-3,4-diamine, 1H-benzotriazole, 1-hydroxybenzotriazole, 1-aminobenzotriazole, 1-carboxy-benzotriazole, 5-chloro-1H-benzotriazole, 5-nitro-1H-benzotriazole, 5-carboxy-1H-benzotriazole, 5-methyl-1H-benzotriazole, 5,6-dimethyl-1H-benzotriazole, 1-(1',2'-dicarboxyethyl)benzotriazole, 1-[N,N-bis(hydroxyethyl)aminomethyl]benzotriazole, 1-[N,N-bis(hydroxyethyl)aminomethyl]-5-methylbenzotriazole, 1-[N,N-bis(hydroxyethyl)aminomethyl]-4-methylbenzotriazole, 2-2'[(methyl-1H-benzotriazol-1-yl)methyl]iminobisethanol and the like.

Examples of the tetrazole compound may include 1H-tetrazole, 5-methyltetrazole, 5-aminotetrazole, 5-phenyltetrazole and the like.

Examples of the indazole compound may include 1H-indazole, 5-amino-1H-indazole, 5-nitro-1H-indazole, 5-hydroxy-1H-indazole, 6-amino-1H-indazole, 6-nitro-1H-indazole, 6-hydroxy-1H-indazole, 3-carboxy-5-methyl-1H-indazole and the like.

Examples of the indole compound may include 1H-indazole, 1-methyl-1H-indole, 2-methyl-1H-indole, 3-methyl-1H-indole, 4-methyl-1H-indole, 5-methyl-1H-indole, 6-methyl-1H-indole, 7-methyl-1H-indole, 4-amino-1H-indole, 5-amino-1H-indole, 6-amino-1H-indole, 7-amino-1H-indole, 4-hydroxy-1H-indole, 5-hydroxy-1H-indole, 6-hydroxy-1H-indole, 7-hydroxy-1H-indole, 4-methoxy-1H-indole, 5-methoxy-1H-indole, 6-methoxy-1H-indole, 7-methoxy-1H-indole, 4-chloro-1H-indole, 5-chloro-1H-indole, 6-chloro-1H-indole, 7-chloro-1H-indole, 4-carboxy-1H-indole, 5-carboxy-1H-indole, 6-carboxy-1H-indole, 7-carboxy-1H-indole, 4-nitro-1H-indole, 5-nitro-1H-indole, 6-nitro-1H-indole, 7-nitro-1H-indole, 4-nitrile-1H-indole, 5-nitrile-1H-indole, 6-nitrile-1H-indole, 7-nitrile-1H-indole, 2,5-dimethyl-1H-indole, 1,2-dimethyl-1H-indole, 1,3-dimethyl-1H-indole, 2,3-dimethyl-1H-indole, 5-amino-2,3-dimethyl-1H-indole, 7-ethyl-1H-indole, 5-(aminomethyl)indole, 2-methyl-5-amino-1H-indole, 3-hydroxymethyl-1H-indole, 6-isopropyl-1H-indole, 5-chloro-2-methyl-1H-indole and the like.

Among these, a preferred heterocyclic compound is a triazole compound, and particularly, 1H-benzotriazole, 5-methyl-1H-benzotriazole, 5,6-dimethyl-1H-benzotriazole, 1-[N,N-bis(hydroxyethyl)aminomethyl]-5-methylbenzotriazole, 1-[N,N-bis(hydroxyethyl)aminomethyl]-4-methylbenzotriazole, 1,2,3-triazole, 2-2'[(methyl-1H-benzotriazol-1-yl)methyl]iminobisethanol and 1,2,4-triazole are preferable. These heterocyclic compounds exhibit a high chemical or physical adsorption force to the surface of a polishing object and thus can form a stronger protective film on the surface of the polishing object. This is advantageous in terms of improving the flatness of the surface of the polishing object after being polished using the polishing composition of the invention.

In addition, examples of the surfactant used as the metal corrosion inhibitor may include an anionic surfactant, a cationic surfactant and an amphoteric surfactant.

Examples of the anionic surfactant may include a polyoxyethylene alkyl ether acetic acid, an alkyl sulfate ester such as a polyoxyethylene alkyl sulfate ester, lauryl sulfate ester and the like, a polyoxyethylene alkyl ether sulfonic acid, an alkyl ether sulfonic acid, an alkyl benzene sulfonic acid, an alkyl phosphate ester, a polyoxyethylene alkyl phosphate ester, polyoxyethylene sulfosuccinic acid, an alkyl sulfosuccinic acid, an alkyl naphthalene sulfonic acid, an alkyl diphenyl ether disulfonic acid, a salt thereof (a sodium salt, an ammonium salt and the like) and the like.

Examples of the cationic surfactant may include an alkyl trimethyl ammonium salt, an alkyl dimethyl ammonium salt, an alkyl benzyl dimethyl ammonium salt, an alkyl amine salt and the like.

Examples of the amphoteric surfactant may include an alkyl betaine, an alkyl amine oxide and the like.

Specific examples of the nonionic surfactant may include a polyoxyalkylene alkyl ether such as polyoxyethylene alkyl ether and the like, a sorbitan fatty acid ester, a glycerin fatty acid ester, a polyoxyethylene fatty acid ester, a polyoxyethylene alkyl amine and an alkyl alkanolamide. Among them, a polyoxyalkylene alkyl ether is preferable.

Among these, preferred surfactant may include a polyoxyethylene alkyl ether acetic acid, a polyoxyethylene alkyl ether sulfate salt, an alkyl ether sulfate salt and an alkyl benzene sulfonate salt. These surfactants exhibit a high chemical or physical adsorption force to the surface of a polishing object and thus can form a stronger protective film on the surface of the polishing object. This is advantageous in terms of improving the flatness of the surface of the polishing object after being polished using the polishing composition of the invention.

The lower limit of the content of the metal corrosion inhibitor in the polishing composition is preferably 0.001 g/L or more, more preferably 0.005 g/L or more and even more preferably 0.01 g/L or more. In addition, the upper limit of the content of the metal corrosion inhibitor in the polishing composition is preferably 10 g/L or less, more preferably 5 g/L or less, and even more preferably 2 g/L or less. In such a range, the flatness of the surface of the polishing object after being polished using the polishing composition is improved and the polishing rate of the polishing object by the polishing composition is improved.

[pH of Polishing Composition]

The lower limit of pH of the polishing composition of the invention is preferably 2 or more. It is possible to diminish the risk that excessive etching of the surface of the polishing object by the polishing composition occurs as the pH of the polishing composition increases.

In addition, the upper limit of pH of the polishing composition is preferably 10 or less. It is possible to further suppress the occurrence of the hollow at the side of the wiring formed by polishing using the polishing compositions as the pH of the polishing composition decreases.

Incidentally, the pH of the polishing composition is preferably 10 or less in consideration of the electrostatic repulsion between the abrasive grains and the film to be polished in the case of polishing the barrier layer as well. In addition, the pH of the polishing composition is preferably from 4 to 8 in terms of polishing rate selection ratio of the copper layer to the barrier layer in the case of intending the polish of the metal wiring layer.

The pH can be adjusted by adding a pH adjusting agent in an appropriate amount. The pH adjusting agent that is used to adjust the pH of the polishing composition to a desired value may be any of an acid or an alkali and may be any of an inorganic compound or an organic compound. Specific examples of the acid may include an inorganic acid such as sulfuric acid, nitric acid, boric acid, carbonic acid, hypophosphorous acid, phosphorous acid, phosphoric acid and the like; and an organic acid such as a carboxylic acid including formic acid, acetic acid, propionic acid, butyric acid, valeric acid, 2-methylbutyric acid, n-hexanoic acid, 3,3-dimethylbutyric acid, 2-ethylbutyric acid, 4-methylpentanoic acid, n-heptanoic acid, 2-methylhexanoic acid, n-octanoic acid, 2-ethylhexanoic acid, benzoic acid, glycolic acid, salicylic acid, glyceric acid, oxalic acid, malonic acid, succinic acid, glutaric acid, adipic acid, pimelic acid, maleic acid, phthalic acid, malic acid, tartaric acid, citric acid, lactic acid and the like and an organic sulfonic acid including methanesulfonic acid, ethanesulfonic acid, isethionic acid and the like. Specific examples of the alkali may include an amine such as ammonia, ethylenediamine, piperazine, potassium hydroxide, sodium hydroxide, and a quaternary ammonium salt such as tetramethylammonium, tetraethylammonium and the like. These pH adjusting agents can be used singly or as a mixture of two or more kinds.

[Other Components]

The polishing composition of the invention may further contain other components such as a complexing agent, a preservative, an antifungal agent, a reductant, a water-soluble polymer and an organic solvent for dissolving a sparingly soluble organic substance if necessary. Hereinafter, the complexing agent that is preferred another component will be described.

[Complexing Agent]

The complexing agent contained in the polishing composition has an action of chemically etching the surface of the polishing object and improving the polishing rate of the polishing object by the polishing composition.

Examples of the usable complexing agent may include an inorganic acid or a salt thereof, an organic acid or a salt thereof, a nitrile compound, an amino acid, a chelating agent and the like. These complexing agents may be used singly or as a mixture of two or more kinds. In addition, the complexing agent used may be a commercially available product or a synthetic product.

Specific examples of the inorganic acid may include hydrochloric acid, sulfuric acid, nitric acid, carbonic acid, boric acid, tetrafluoroboric acid, hypophosphorous acid, phosphorous acid, phosphoric acid, pyrophosphoric acid and the like.

Specific examples of the organic acid may include a carboxylic acid such as a monocarboxylic acid including formic acid, acetic acid, propionic acid, butyric acid, valeric acid, 2-methylbutyric acid, n-hexanoic acid, 3,3-dimethylbutyric acid, 2-ethylbutyric acid, 4-methylpentanoic acid, n-heptanoic acid, 2-methylhexanoic acid, n-octanoic acid, 2-ethylhexanoic acid, lactic acid, glycolic acid, glyceric acid, benzoic acid, salicylic acid and the like; and a polycarboxylic acids including oxalic acid, malonic acid, succinic acid, glutaric acid, gluconic acid, adipic acid, pimelic acid, maleic acid, phthalic acid, fumaric acid, malic acid, tartaric acid, citric acid and the like. In addition, it is also possible to use a sulfonic acid such as methanesulfonic acid, ethanesulfonic acid and isethionic acid.

As the complexing agent, a salt of the inorganic acids or organic acids may be used. It is possible to expect the pH buffering action particularly in the case of using a salt produced by a weak acid and a strong base, a salt produced by a strong acid and a weak base or a salt produced by a weak acid and a weak base. Examples of such a salt may include potassium chloride, sodium sulfate, potassium nitrate, potassium carbonate, potassium tetrafluoroborate, potassium pyrophosphate, potassium oxalate, trisodium citrate, (+) potassium tartrate, potassium hexafluorophosphate and the like.

Specific examples of the nitrile compound may include acetonitrile, aminoacetonitrile, propionitrile, butyronitrile, isobutyronitrile, benzonitrile, glutarodinitrile, methoxyacetonitrile and the like.

Specific examples of the amino acid may include glycine, α-alanine, β-alanine, N-methyl glycine, N,N-dimethylglycine, 2-aminobutyric acid, norvaline, valine, leucine, norleucine, isoleucine, phenylalanine, proline, sarcosine, ornithine, lysine, taurine, serine, threonine, homoserine, tyrosine, bicine, tricine, 3,5-diiodo-tyrosine, β-(3,4-dihydroxyphenyl)-alanine, thyroxine, 4-hydroxy-proline, cysteine, methionine, ethionine, lanthionine, cystathionine, cystine, cysteic acid, aspartic acid, glutamic acid, S-(carboxymethyl)-cysteine, 4-aminobutyric acid, asparagine, glutamine, azaserine, arginine, canavanine, citrulline, δ-hydroxy-lysine, creatine, histidine, 1-methyl-histidine, 3-methyl-histidine and tryptophan.

Specific examples of the chelating agent may include nitrilotriacetic acid, diethylenetriaminepentaacetic acid, ethylenediaminetetraacetic acid, N,N,N-tri-methylenephosphonic acid, ethylenediamine-N,N,N',N'-tetramethylenesulfonic acid, trans-cyclohexanediaminetetraacetic acid, 1,2-diaminopropanetetraacetic acid, glycol ether diamine tetraacetic acid, ethylenediamineortho-hydroxyphenylacetic acid, ethylenediaminesuccinic acid (SS isomer), N-(2-carboxylate ethyl)-L-aspartic acid, β-alaninediacetic acid, 2-phosphonobutane-1,2,4-tricarboxylic acid, 1-hydroxyethylidene-1,1-diphosphonic acid, N,N'-bis(2-hydroxybenzyl)ethylenediamine-N,N'-diacetic acid, 1,2-dihydroxybenzene-4,6-disulfonic acid and the like.

Among these, at least one kind selected from the group consisting of an inorganic acid or a salt thereof, a carboxylic acid or a salt thereof and a nitrile compound is preferable, and an inorganic acid or a salt thereof is more preferable from the viewpoint of stability of the complex structure with the metal compound contained in the polishing object. In addition, in the case of using those having a pH adjusting function (for example, various kinds of acids) as the various kinds of the complexing agents described above, the complexing agent may be used as at least a part of the pH adjusting agent.

The lower limit of the content (concentration) of complexing agent in the polishing composition is not particularly limited since the effect is exhibited even in a small amount, but the lower limit is preferably 0.001 g/L or more, more preferably 0.01 g/L or more and even more preferably 1 g/L or more. In addition, the upper limit of the content (concentration) of complexing agent in the polishing composition of the invention is preferably 20 g/L or less, more preferably 15 g/L or less and even more preferably 10 g/L or less. In such a range, this is advantageous in terms of improving the polishing rate of the polishing object and improving the flatness of the surface of the polishing object after being polished using the polishing composition.

[Method for Producing Polishing Composition]

The method for producing a polishing composition of the invention is not particularly limited, and for example, the polishing composition can be obtained by mixing abrasive grains, an oxidant, a metal corrosion inhibitor and other components if necessary in water through stirring.

The temperature when mixing the respective components is not particularly limited but is preferably from 10 to 40° C., and heating may be performed in order to increase the dissolution rate. In addition, the mixing time is not also particularly limited.

[Polishing Method and Method for Producing Substrate]

As described above, the polishing composition of the invention is suitably used in the polishing of a polishing object having a barrier layer, a metal wiring layer and an insulating film. Hence, the invention provides a polishing method to polish a polishing object having a barrier layer, a metal wiring layer and an insulating film with the polishing composition of the invention. In addition, the invention also provides a method for producing a substrate including a step of polishing a polishing object having a barrier layer, a metal wiring layer and an insulating film by the polishing method.

As the polishing apparatus, it is possible to use a general polishing apparatus which is equipped with a holder to hold a substrate having a polishing object and the like, a motor capable of changing the rotation number and the like and has a polishing table capable of being attached with a polishing pad (polishing cloth).

As the polishing pad, it is possible to use a general nonwoven fabric, polyurethane, a porous fluorine resin and the like without particular limitation. The polishing pad is preferably subjected to a grooving process so as to save the polishing liquid.

The polishing condition is not also particularly limited, and for example, the rotational speed of the polishing table is preferably from 10 to 500 rpm and the pressure applied to the substrate having the polishing object (polishing pressure) is preferably from 0.5 to 10 psi. The method to supply the polishing composition to the polishing pad is not also particularly limited, and for example, a method of continuously supplying by pump or the like is employed. There is no limitation on the supply amount, but it is preferable that the surface of the polishing pad be always covered with the polishing composition of the invention.

After the polishing is completed, the substrate is washed with running water and the water droplets attached on the substrate are shaken off and dried by a spin dryer or the like, thereby obtaining a substrate having a barrier layer, a metal wiring layer and an insulating film.

The polishing composition of the invention may be a one-component type or a multi-component type including a two-component type. In addition, the polishing composition of the invention may be prepared by diluting a stock solution of the polishing composition, for example, 10 times or more using a diluent such as water.

EXAMPLES

The invention will be described in more detail with reference to the following examples and Comparative Examples. However, the technical scope of the invention is not limited to only the following Examples.

Examples 1 and 2 and Comparative Examples 1 to 6

The polishing composition was prepared by mixing (mixing temperature: about 25° C. and mixing time: 10 minutes) colloidal silica having the conditions presented in the following Table 2 as the abrasive grains, hydrogen peroxide at 0.6% by weight with respect to the composition as the oxidant and 1.2 g/L (composition) of 1H-BTA as the metal corrosion inhibitor in water through stirring so that each component had the above concentration. The pH of the composition was adjusted to 2.10 by confirming with a pH meter while adding nitric acid as the pH adjusting agent.

The measurement of the specific surface area of colloidal silica was conducted by the BET method using the "Flow SorbII 2300" manufactured by Micromeritics Instrument Corporation. In addition, the average secondary particle size of the colloidal silica particles was determined after measuring with a particle size measuring device of which the principle was the dynamic light scattering method.

Measurement of Aspect Ratio of Abrasive Grains;

The aspect ratio or colloidal silica as the abrasive grains used in the preparation of the polishing composition was determined as follows. The value obtained by dividing the length of the long side of the smallest rectangle circumscribing the image of the colloidal silica particles taken by a scanning electron microscope by the length of the short side of the same rectangle was measured for 500 colloidal silica particles and the average of the values thus obtained was calculated. Incidentally, the measurement was conducted for the image taken by a scanning electron microscope using the image analysis software.

Measurement of Polishing Rate;

As the polishing object: a 12 inches wafer fabricated by forming a Cu film, a Ta film and a TEOS film on a silicon substrate was used. The polishing rate was measured when the surface of the polishing object was polished for 60 seconds using the polishing composition thus obtained under the first polishing condition presented in the following Table 1. The polishing rate was determined by dividing the difference in thickness of each film before and after polishing measured using a sheet resistance measuring device of which the principle was a four-probe DC method by the polishing time. The polishing rate to be measured is in a practical level when the value of the Cu film is 200 Å/min or more and 1000 Å/min or less, the value of the Ta film is 200 Å/min or more, the value of the TEOS film is 500 Å/min or more, and the value of fang quantity of the TEOS film is 50 nm or less.

TABLE 1

<First polishing condition>

Polishing apparatus: single sided CMP polishing apparatus for 200 mm
Polishing pad: polyurethane foam
Polishing pressure: 2.7 psi (about 18.6 kpa)
Rotation number of polishing table: 90 rpm
Supply of polishing composition: constant flow
Rotation number of carrier: 90 rpm
<Second polishing condition>

Polishing apparatus: single sided CMP polishing apparatus for 200 mm
Polishing pad: polyurethane foam
Polishing pressure: 1.5 psi (about 10.3 kpa)
Rotation number of polishing table: 90 rpm
Supply of polishing composition: constant flow
Rotation number of carrier: 90 rpm Measurement of Erosion and Fang;

The surface of the Cu/TEOS pattern wafer (Cu film thickness: 700 nm and trench depth: 300 nm before polishing) was polished using the polishing composition thus obtained under the first polishing condition presented in Table 1 above until the copper film had a thickness of 200 nm. Thereafter, the surface of the copper pattern wafer after polishing was polished using the same polishing composition under the second polishing condition presented in Table 1 above until the barrier layer (material: Ta) was exposed. The fang of the Cu/TEOS pattern wafer after being subjected to the two-step polishing in this manner was measured in the boundary region between the pattern portion in which the metal embedded wiring portion having a width of 0.25 μm and the insulating film portion were alternately formed and the peripheral insulating film portion. Incidentally, a stylus type step measuring device was used for the measurement of fang. The evaluation results are presented in the following Table 2. The fang quantity to be measured is in a practical level when the value is 50 nm or less.

In addition, the erosion of the Cu/TEOS pattern wafer after being subjected to the above two-step polishing was also measured in the region of the pattern portion in which the metal embedded wiring portion having a width of 0.25 μm and the insulating film portion were alternately formed. Incidentally, a stylus type step measuring device was used for the measurement of erosion. The evaluation results are presented in the following Table 2. The erosion quantity to be measured is in a practical level when the value is 50 nm or less.

TABLE 2

| | Abrasive grains | | | | | | Evaluation | | | |
| --- | --- | --- | --- | --- | --- | --- | --- | --- | --- | --- |
| | Average primary particle size (nm) | Average secondary particle size (nm) | Degree of association | Aspect ratio | D90/D10 | Content (% by weight) | Polishing rate (A/min) | | | Fang (nm) | Erosion (nm) |
| | | | | | | | Cu | Ta | TEOS | | |
| Comparative Example 1 | 15 | 36 | 2.40 | 1.38 | 2.1 | 6.0 | 222 | 569 | 552 | 188 | 105 |
| Comparative Example 2 | 25 | 49 | 2.00 | 1.36 | 1.7 | 3.0 | 245 | 306 | 894 | 298 | 38 |
| Comparative Example 3 | 19 | 29 | 1.50 | 1.24 | 1.9 | 6.0 | 242 | 544 | 477 | 207 | 0 |
| Comparative Example 4 | 31 | 50 | 1.60 | 1.09 | 1.3 | 15.0 | 208 | 682 | 489 | 0 | 0 |
| Comparative Example 5 | 35 | 70 | 2.00 | 1.26 | 1.6 | 4.0 | 280 | 385 | 852 | 233 | 289 |
| Comparative Example 6 | 31 | 85 | 2.70 | 1.38 | 1.6 | 3.0 | 288 | 380 | 1115 | 465 | 251 |
| Example 1 | 90 | 211 | 2.34 | 1.20 | 2.0 | 10.0 | 352 | 258 | 987 | 30 | 0 |
| Example 2 | 50 | 101.1 | 2.02 | 1.16 | 2.3 | 12.0 | 581 | 978 | 1397 | 40 | 0 |

As presented in Table 2, it has been acknowledged that a significantly superior effect is exhibited in the maintenance of a high polishing rate for the barrier layer and the interlayer insulating film as well as the suppression of the surface defect such as erosion or fang in the case of using the polishing compositions of Examples 1 and 2 as compared to the polishing compositions of Comparative Examples 1 to 6 which do not satisfy the conditions of the invention.

Examples 3 to 5 and Comparative Examples 7 to 10

The polishing composition was prepared by mixing (mixing temperature: about 25° C. and mixing time: about 20 minutes) colloidal silica having the conditions presented in the following Table 5 as the abrasive grains, hydrogen peroxide at 1.2% by weight with respect to the composition as the oxidant, 0.29 g/L (composition) of 2-2'[(methyl-1H-benzotriazol-1-yl)methyl]iminobisethanol as the metal corrosion inhibitor, 0.22 g/L (composition) of ammonium lauryl sulfate, 0.63 g/L (composition) of polyoxyalkylene alkyl ether, and 10 g/L (composition) of glycine as the complexing agent in water through stirring so that each component had the above concentration. The pH of the composition was adjusted to 7.2 by confirming with a pH meter while adding potassium hydroxide as the pH adjusting agent.

Measurement of Polishing Rate;

As the polishing object, a silicon substrate fabricated by forming a metal layer (copper film) having a thickness of 1.5 µm on the surface (BTW) was used. The polishing rate was measured when the surface of the polishing object was polished for 60 seconds under the first polishing condition presented in the following Table 3. The polishing rate was determined by dividing the difference in thickness of each film before and after polishing measured using a sheet resistance measuring device of which the principle was a four-probe DC method by the polishing time. The polishing rate to be measured is in a practical level when the value of the Cu film is 500 Å/min or more.

TABLE 3

<First polishing condition>

Polishing apparatus: single sided CMP polishing apparatus for 200 mm
Polishing pad: polyurethane foam
Polishing pressure: 3.0 psi (about 20.7 kpa)
Rotation number of polishing table: 113 rpm
Rotation number of carrier: 90 rpm
Supply of composition: 150 ml/min Measurement of Dishing;

The surface of the copper pattern wafer (Cu/TEOS pattern wafer, Cu film thickness: 700 nm and trench depth: 300 nm before polishing) was polished using the polishing composition thus obtained under the first polishing condition presented in Table 3 above until the copper film had a thickness of 200 nm. Thereafter, the surface of the copper pattern wafer after polishing was polished using the same polishing composition under the second polishing condition presented in the following Table 4 until the barrier layer (material: tantalum) was exposed. The dishing quantity (dishing depth) of the copper pattern wafer after being subjected to the two-step polishing in this manner was measured in the region in which the wiring having a width of 100 µm and the insulating film (material: tantalum) having a width of 100 µm were alternately lined up using an atomic force microscope. The evaluation results are presented in the following Table 5. Incidentally, the dishing quantity to be measured is in a practical level when the value is 400 Å or leas, and the term "not clear" indicates a state in which the polishing does not proceed until the barrier layer is exposed under the second polishing condition.

TABLE 4

<Second polishing condition>

Polishing apparatus: single sided CMP polishing apparatus for 200 mm
Polishing pad: polyurethane foam
Polishing pressure: 1.3 psi (about 9.0 kpa)
Rotation number of polishing table: 113 rpm
Rotation number of carrier: 90 rpm
Supply of composition: 200 ml/min

TABLE 5

| | Abrasive grains | | | | | | Cu polishing rate (Å/min) | Dishing (Å) |
|---|---|---|---|---|---|---|---|---|
| | Average primary particle size (nm) | Average secondary particle size (nm) | Degree of association | Aspect ratio | D90/D10 | Content (% by weight) | | |
| Comparative Example 6 | 12.0 | 32.3 | 2.69 | 1.38 | 2.1 | 0.1 | 3345 | 461.7 |
| Comparative Example 7 | 35.4 | 65.5 | 1.85 | 1.24 | 1.6 | 0.1 | 612 | not clear |
| Comparative Example 8 | 58.1 | 83.0 | 1.43 | 1.19 | 1.3 | 0.1 | 626 | not clear |
| Comparative Example 9 | 91.5 | 218.0 | 2.38 | 1.25 | 2.0 | 0.1 | 727 | not clear |
| Example 3 | 33.0 | 75.50 | 2.29 | 1.00 | 3.81 | 0.1 | 6981 | 345 |
| Example 4 | 30.5 | 63.90 | 2.09 | 1.09 | 2.6 | 0.1 | 6115 | 307 |
| Example 5 | 58.2 | 80.20 | 1.38 | 1.06 | 2.7 | 0.1 | 7379 | 286 |

As presented in Table 5, it has been acknowledged that a significantly superior effect is exhibited in the maintenance of a high polishing rate for the metal wiring layer as well as the suppression of the surface defect such as dishing in the case of using the polishing composition of Examples 3 to 5 as compared to the polishing compositions of Comparative Examples 6 to 9 which do not satisfy the conditions of the invention.

This application is based upon the prior Japanese Patent Application No. 2012-243073, filed on Nov. 2, 2012, the entire contents of which are incorporated herein by reference.

REFERENCE SIGNS LIST

11: Trench
12: Insulating film
13: Barrier layer
14: Metal wiring layer

The invention claimed is:

1. A polishing composition used in polishing a polishing object having a barrier layer, a metal wiring layer and an insulating film, the polishing composition comprising:
   abrasive grains;
   an oxidant;
   a metal corrosion inhibitor;
   a pH adjusting agent; and
   water, wherein
   an aspect ratio of the abrasive grains is 1.22 or less and more than 1.0,
   a ratio D90/D10 of a diameter D90 of particles when a cumulative particle weight from a fine particle side reaches 90% of a total particle weight to a diameter D10 of particles when the cumulative particle weight from the fine particle side reaches 10% of the total particle weight of the entire particles is 1.5 or more and 3.0 or less in a particle size distribution of the abrasive grains determined by a laser diffraction scattering method.

2. The polishing composition according to claim 1, wherein the abrasive grains are colloidal silica.

3. The polishing composition according to claim 1, wherein an average primary particle size of the abrasive grains is from 20 nm to 200 nm.

4. The polishing composition according to claim 1, wherein the barrier layer contains tantalum or a noble metal.

5. A polishing method to polish a polishing object having a barrier layer, a metal wiring layer and an insulating film using the polishing composition according to claim 1.

6. A method for producing a substrate, comprising:
   a step of polishing a polishing object having a barrier layer, a metal wiring layer and an insulating film by the polishing method according to claim 5.

* * * * *